(12) United States Patent
Baftiri

(10) Patent No.: US 11,622,443 B2
(45) Date of Patent: Apr. 4, 2023

(54) COMPONENT CARRIER AND METHOD OF MANUFACTURING THE SAME

(71) Applicant: AT&S Austria Technologie & Systemtechnik Aktiengesellschaft, Leoben (AT)

(72) Inventor: Artan Baftiri, Trento (IT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/301,756

(22) Filed: Apr. 13, 2021

(65) Prior Publication Data

US 2021/0329779 A1    Oct. 21, 2021

(30) Foreign Application Priority Data

Apr. 16, 2020 (CN) .......................... 202010301924.0

(51) Int. Cl.
| | |
|---|---|
| H05K 1/02 | (2006.01) |
| H05K 1/03 | (2006.01) |
| H05K 1/14 | (2006.01) |
| H05K 1/18 | (2006.01) |
| H05K 3/00 | (2006.01) |
| H05K 3/02 | (2006.01) |
| H05K 3/06 | (2006.01) |
| H05K 3/46 | (2006.01) |

(52) U.S. Cl.
CPC .......... *H05K 1/0271* (2013.01); *H05K 3/0005* (2013.01); *H05K 3/4673* (2013.01); *H05K 2201/09136* (2013.01)

(58) Field of Classification Search
CPC .......... H05K 1/02; H05K 1/03; H05K 1/0271; H05K 1/14; H05K 1/18; H05K 1/115; H05K 1/144; H05K 1/185; H05K 3/00; H05K 3/02; H05K 3/05; H05K 3/06; H05K 3/044; H05K 3/4602; H05K 3/4673; H05K 3/4697
USPC ................... 174/255, 251, 258, 266; 156/280
See application file for complete search history.

(56) References Cited

U.S. PATENT DOCUMENTS

| | | | |
|---|---|---|---|
| 10,522,497 B2 * | 12/2019 | Lee | ................. H01L 24/20 |
| 2010/0059267 A1 | 3/2010 | Lee | |

(Continued)

FOREIGN PATENT DOCUMENTS

| | | |
|---|---|---|
| CN | 107911935 A | 4/2018 |
| EP | 2 066 157 A2 | 6/2009 |

OTHER PUBLICATIONS

Tomezak, A.; Extended European Search Report in Application No. 21 167 304.1; pp. 1-8; Aug. 23, 2021; European Patent Office; 80298, Munich, Germany.

*Primary Examiner* — Xiaoliang Chen
(74) *Attorney, Agent, or Firm* — Robert A. Blaha; Smith Tempel Blaha LLC

(57) ABSTRACT

A component carrier includes a stack having a first electrically insulating layer structure and a first electrically conductive layer structure arranged on the first electrically insulating layer structure. The first electrically insulating layer structure has at least one first covered portion, which is covered by the first electrically conductive layer structure, and at least one first non-covered portion, which is not covered by the first electrically conductive layer structure. The first electrically insulating layer structure defines a recess at the at least one first non-covered portion.

23 Claims, 4 Drawing Sheets

(56) References Cited

U.S. PATENT DOCUMENTS

| | | | |
|---|---|---|---|
| 2012/0085572 A1* | 4/2012 | Sakai | H01L 23/5389 |
| | | | 29/829 |
| 2014/0182897 A1* | 7/2014 | Lee | H05K 1/115 |
| | | | 174/266 |
| 2017/0048984 A1* | 2/2017 | Weidinger | H01L 24/20 |
| 2017/0069602 A1* | 3/2017 | Lin | H01L 21/486 |
| 2017/0194240 A1* | 7/2017 | Park | H01L 24/48 |
| 2018/0040551 A1* | 2/2018 | Lin | H01L 23/16 |
| 2018/0213634 A1* | 7/2018 | Tuominen | H01L 24/20 |
| 2019/0288398 A1* | 9/2019 | Taniguchi | H05K 3/0044 |
| 2019/0378771 A1* | 12/2019 | Stahr | H05K 3/4697 |
| 2020/0092994 A1 | 3/2020 | Toshimitsu et al. | |
| 2022/0039259 A1* | 2/2022 | Xin | H05K 1/0393 |
| 2022/0046788 A1* | 2/2022 | Haruna | H05K 1/0218 |

* cited by examiner

COMPONENT CARRIER AND METHOD OF MANUFACTURING THE SAME

CROSS-REFERENCE TO RELATED APPLICATION

The present application claims the benefit of the filing date of the Chinese Patent Application No. 202010301924.0, filed Apr. 16, 2020, the disclosure of which is hereby incorporated herein by reference.

TECHNICAL FIELD

Embodiments of the invention relate to a component carrier and to a method of manufacturing a component carrier.

Technological Background

FIG. 4 shows an example of a conventional method of manufacturing a component carrier 100.

In a step S10, a stack is provided having an electrically insulating layer structure 200 and a first electrically conductive layer structure 300 arranged on the electrically insulating layer structure 200, and a second electrically conductive layer structure 400 arranged on the electrically insulating layer structure 200 opposite to the first electrically conductive layer structure 300. The first electrically conductive layer structure 300 is partially removed or patterned to obtain first covered portions 221, where the electrically insulating layer structure 200 is covered by the first electrically conductive layer structure 300, and first non-covered portions 222, where the electrically insulating layer structure 200 is not covered by the first electrically conductive layer structure 300. The second electrically conductive layer structure 400 is partially removed or patterned to obtain second covered portions 223, where the electrically insulating layer structure 200 is covered by the second electrically conductive layer structure 400, and second non-covered portions 224, where the electrically insulating layer structure 200 is not covered by the second electrically conductive layer structure 400.

In a step S11, a first further electrically insulating layer structure 500 is laminated on the first electrically conductive layer structure 300, and a second further electrically insulating layer structure 600 is laminated on the second electrically conductive layer structure 400.

Step S12 shows the resulting component carrier 100 according to the prior art. In the example of the prior art component carrier 100, a thickness of the first electrically conductive layer structure 300 is smaller than a thickness of the second electrically conductive layer structure 400, which leads to a so-called copper asymmetry. To achieve the same dielectric thicknesses of the first and second further electrically insulating layer structures 500, 600, the second further electrically insulating layer structure 600 must be thicker than the first further electrically insulating layer structure 500, which may result in warpage of the component carrier 100. The stress caused by volumetric shrinkage would be different in the first and second further electrically insulating layer structures 500, 600 which results in unbalanced stress of the component carrier 100. In brief, the difference in thickness of the first and second electrically conductive layer structures 300, 400 will impact the warping of the component carrier 100.

SUMMARY

There may be a need to provide a component carrier and a method of manufacturing the same, by which warpage of the component carrier can be avoided or reduced. This need is achieved by the subject matters of the independent claims.

According to an exemplary embodiment of the invention, a component carrier comprises a stack having a first electrically insulating layer structure and a first electrically conductive layer structure arranged on the first electrically insulating layer structure, wherein the first electrically insulating layer structure comprises at least one first covered portion, which is covered by the first electrically conductive layer structure, and at least one first non-covered portion, which is not covered by the first electrically conductive layer structure. The first electrically insulating layer structure comprises a recess at the at least one first non-covered portion.

According to another exemplary embodiment of the invention, a method of manufacturing a component carrier is provided, wherein the method comprises the following steps: providing a stack having a first electrically insulating layer structure and a first electrically conductive layer structure arranged on the first electrically insulating layer structure; partially removing or patterning the first electrically conductive layer structure to obtain at least one first covered portion, where the first electrically insulating layer structure is covered by the first electrically conductive layer structure, and at least one first non-covered portion, where the first electrically insulating layer structure is not covered by the first electrically conductive layer structure. A recess is formed in the first electrically insulating layer structure at the at least one first non-covered portion.

According to another exemplary embodiment of the invention, a method of designing a component carrier comprises the following steps in the order of: a) carrying out the steps of the above-mentioned method of manufacturing a component carrier; b) measuring a warpage (deformation) of the component carrier; c) determining whether or not the warpage is allowable; d) repeating the steps a) and b) in case the warpage is not allowable, while a number, a location, and/or a depth of the at least one recess is changed; otherwise f) designing the component carrier by use of that number, location and/or depth of the at least one recess where the warpage is allowable.

OVERVIEW OF EMBODIMENTS

The at least one recess, which is for example made by plasma etching, reactive ion etching, selective laser dielectric removal, selective sand blasting or any other kind of mechanical material removal method, can help to control the volume of resin needed to build up a further dielectric such as a first further electrically insulating layer structure on the first electrically conductive layer structure, and thus the user can define the dielectric layer thickness in order to balance deformation and warpage. A volumetric shrinkage that might occur during curing the dielectric material can be balanced on the top and bottom sides of the component carrier.

It is conceivable that the component carrier comprises a plurality of first non-covered portions, wherein only one or only some of the plurality of first non-covered portions are provided with a corresponding recess so that there is at least one first non-covered portion without recess. The number and the size of the recess or the recesses can be determined by DOE (design of experiments) in the above-mentioned method of designing a component carrier. For example, warpage performances can be simulated, e.g., virtually based on a virtual component carrier design or model, and further studied on the physical component carrier. For example, warpage of the component carrier can be measured on unit level. The root cause of the warpage can be analyzed, and a warpage optimization can be obtained by simulations. Alternatively, a DOE plan can be made to prove a concept and a warpage reduction tendency by removing/etching different amounts of resin of the first electrically insulating layer structure.

The present invention achieves a balanced stress ratio at the first and second further electrically insulating layer structures as the volumes thereof are optimized. As a result, the present invention offers an improved yield and enables asymmetric build-ups, while the method of manufacturing is easy to control. Examples for asymmetric build-ups would be build-ups with asymmetric layer thickness or layer counts.

In the following, further exemplary embodiments of the present invention will be explained.

In an embodiment, the step of forming the recess, particularly by plasma etching, reactive-ion etching, selective laser dielectric removal, or selective sand blasting, is carried out such that a thickness of the first electrically insulating layer structure in the first covered portion is greater than a thickness of the first electrically insulating layer structure in the first non-covered portion. A difference between the above-mentioned thicknesses, that means a removal/etching depth, can be between 1 to 25 μm. The plasma gas can be Ar, $CF_4$, $O_2$, $SF_6$ or any other suitable gas.

Any kind of removing a dielectric material to form the recess is possible. The selective laser dielectric removal can selectively remove the material without additional process steps. For plasma etching and selective sand blasting, a mask can be used in order to selectively remove the material, as these removal technologies can cover the whole stack surface at once. The removed/etched recess can be filled by a desired material so as to add a material volume which counteracts a volumetric shrinkage behavior of the stack.

In an embodiment, the first electrically insulating layer structure in the first covered portion and the first non-covered portion is integrally formed of the same material. The term "integrally formed of the same material" can be interpreted in that the at least one first covered portion has not been deposited or layered upon the remaining part of the first electrically insulating layer structure.

In an embodiment, the stack further comprises a second electrically insulating layer structure, which can be identical to the first electrically insulating layer structure, and a second electrically conductive layer structure arranged on the second electrically insulating layer structure, wherein the method further comprises: partially removing or patterning the second electrically conductive layer structure to obtain at least one second covered portion, where the second electrically insulating layer structure is covered by the second electrically conductive layer structure, and at least one second non-covered portion, where the second electrically insulating layer structure is not covered by the second electrically conductive layer structure; arranging a first further electrically insulating layer structure on the first electrically conductive layer structure; arranging a second further electrically insulating layer structure on the second electrically conductive layer structure; wherein a thickness of the first further electrically insulating layer structure at the first non-covered portion is not equal to a thickness of the second further electrically insulating layer structure at the second non-covered portion. The term "not equal to" can be interpreted in that a difference between the above-mentioned thicknesses is larger than 5%, preferably larger than 10%.

The first and second further electrically insulating layer structures can be a prepreg such as FR-4 or ABF® (Ajinomoto Build-up Film). ABF® is a registered mark of the Ajinomoto Co., Inc. of Tokyo, Japan. Other possible materials could be photo-imageable dielectrics (PIDs). The first and second further electrically insulating layer structures can be laminated or molded.

In an embodiment, a thickness of the first electrically conductive layer structure is smaller than a thickness of the second electrically conductive layer structure.

In an embodiment, a surface ratio between a sum of all the first covered portions of the first electrically insulating layer structure and the entire first electrically insulating layer structure is less than 90%. It turned out that an excellent volume control of the first further electrically insulating layer structure can be achieved when the metal (copper) distribution is less than 90%.

In an embodiment, the first further electrically insulating layer structure is made of a resin such as a prepreg or ABF® with fillers except for glass fibers. It turned out that excellent removal/etching results can be achieved when the resin is free from glass fibers. In general, for warpage issues, filler particles should be as small as possible. However, relatively large filler particles are sometimes necessary to achieve an improved copper adhesion in the build-up stack. Therefore, the filler type needs to be adjusted based on needed roughness, and all sizes and types are possible (glass fillers, ceramic fillers, also without fillers), as long as there are no glass fibers or glass fiber mat in the resin of the first further electrically insulating layer structure. It is the intention to control or counteract the warping effect from the volumetric shrinkage of the resin, wherein the controlled volumetric shrinkage is used to reduce residual stress to balance the warpage. Based on the specific design of the component carrier, the material removal to form the recesses is determined. The warpage function can provide information on how much material has to be removed, and on which layer in a multilayer component carrier. As a result, material can be removed from one layer, several layers or even all layers. For example, in a multilayer component carrier, if only one layer or some layers is/are critical for warpage, the method is only applied on the critical layer(s) in order to control the warpage. The other layer(s) can be provided with or without fillers just following the specific component carrier design, and/or the other layer(s) can even be provided without any recess in the first electrically insulating layer structure at the at least one first non-covered portion just following the specific component carrier design.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as an example of an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In an embodiment of the method, c is a thickness of the first further electrically insulating layer structure at the first covered portion, d is a thickness of the first electrically conductive layer structure at the first covered portion, and e is a depth of the recess, wherein e is selected based on c, d such that a warpage of the component carrier is reduced or minimized. In a preferred embodiment, e is selected by use of a simulation model with given values of c, d and/or by use of a warpage function which images the warpage as a function of e with given values of c, d.

In an embodiment of the method, a is a thickness of the second further electrically insulating layer structure at the second covered portion, b is a thickness of the second electrically conductive layer structure at the second covered portion, c is a thickness of the first further electrically insulating layer structure at the first covered portion, d is a thickness of the first electrically conductive layer structure at the first covered portion, and e is a depth of the recess; wherein e is selected based on a, b, c, d such that a warpage of the component carrier is reduced or minimized. In a preferred embodiment, e is selected by use of a simulation model with given values of a, b, c, d and/or by use of a warpage function which images the warpage as a function of e with given values of a, b, c, d.

As explained above, it is the intention to control or counteract the warping effect from the volumetric shrinkage of the resin, wherein the controlled volumetric shrinkage is used to reduce residual stress to balance the warpage. Based on customer design of the component carrier, the material removal to form the recesses is determined. The warpage function can provide information on how much material has to be removed, and on which layer in a multilayer component carrier. As a result, material can be removed from one layer, several layers or even all layers. For example, in a multilayer component carrier, if only one layer is critical for warpage, the method is only applied on this layer in order to control the warpage.

With regard to the shape of the recesses at the first non-covered portions, any shape is possible. For example, the recesses can have the shape of a cuboid having a rectangle bottom, where walls of the recess are perpendicular to the bottom. The recesses can also have a U-shaped or V-shaped cross-section. Also, the shape of the recesses can be determined based on the warpage function which is obtained during a simulation.

In an embodiment, the first electrically insulating layer structure comprises a plurality of first non-covered portions which are not covered by the first electrically conductive layer structure; and the first electrically insulating layer structure comprises at least one first non-covered portion of the plurality of first non-covered portions, where the recess is not formed. For example, the component carrier can comprise at least a part of a power section and at least a part of a control section, wherein the control section is configured to control the power section. The power section and the control section are at least partly formed by the first electrically conductive layer structure, and the control section comprises the recess, and the power section comprises the at least one first non-covered portion of the plurality of first non-covered portions, where the recess is not formed.

In other words, the present invention is applicable for fine line applications such as for the control section as well as for relatively thick copper applications such as for the power section.

By selectively removing material/volume to form the recess, the warping behavior cannot only be vertically compensated (top/bottom), i.e., with regard to mismatches in volumetric shrinkage and/or CTE on two different layers which are vertically stacked, but also with regard to horizontal differences within one single layer, i.e., with regard to mismatches in volumetric shrinkage and/or CTE in the same layer, e.g., in a component carrier, where the power section and the control section are located on the same level. Therefore, the present invention is particularly advantageous for power applications having a power section, where rather few areas are substantially free of copper, and a control section, where less copper but a large first electrically insulating layer structure is usually present. The warpage compensation by forming the recess(es) has therefore to be done in areas of less copper, for example in the control section.

In another embodiment, both the power section and the control section can each comprise at least one recess, wherein a depth of the recess in the power section is smaller than a depth of the recess in the control section.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
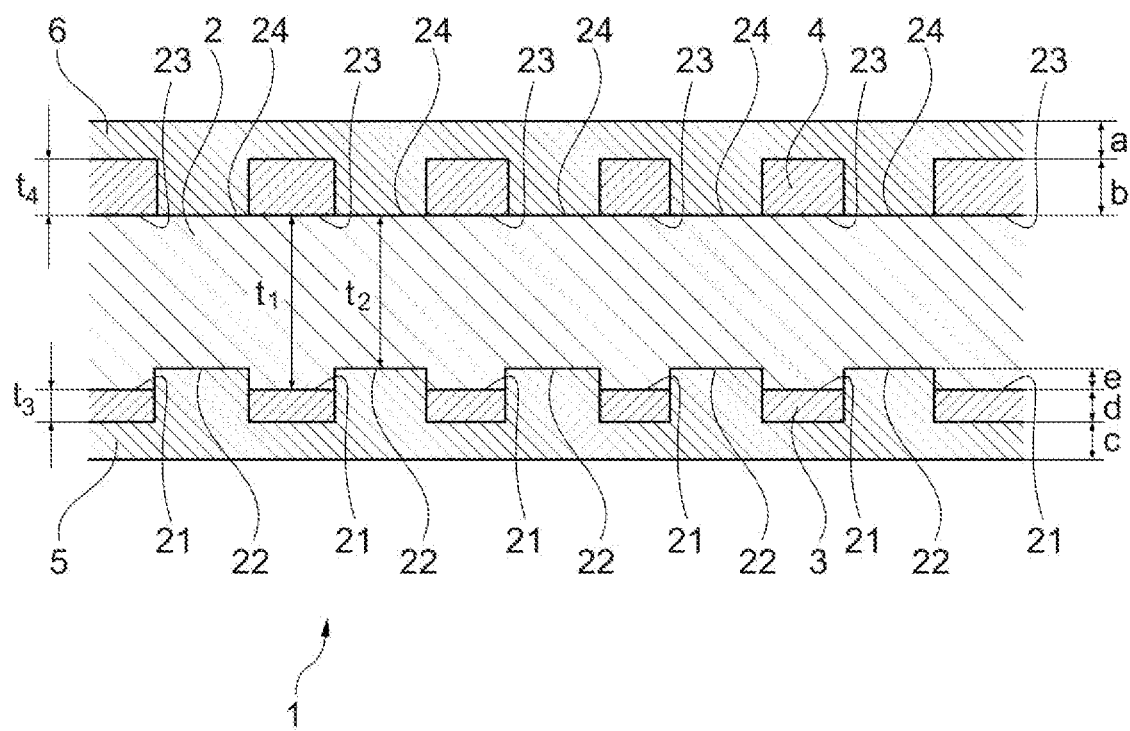
FIG. 1 illustrates a cross-sectional view of a component carrier according to an exemplary embodiment of the invention.

The illustrations in the drawings are schematically presented. In different drawings, similar or identical elements are provided with the same reference signs.

FIG. 1 illustrates a cross-sectional view of a component carrier 1 according to an exemplary embodiment of the invention. The component carrier 1 comprises a stack having a first electrically insulating layer structure 2 and a first electrically conductive layer structure 3 arranged on the first electrically insulating layer structure 2. The first electrically conductive layer structure 3 can comprise copper and be formed by conventional photolithography and etching methods. The first electrically insulating layer structure 2 comprises a plurality of first covered portions 21, which are covered by the first electrically conductive layer structure 3, and a plurality of first non-covered portions 22, which are not covered by the first electrically conductive layer structure 3. The first electrically insulating layer structure 2 comprises at the surface, which is connected to the first electrically conductive layer structure 3, recesses at each of the plurality of first non-covered portions 22. The first electrically insulating layer structure 2 thus has a patterned structure.

A thickness t1 of the first electrically insulating layer structure 2 in the first covered portions 21 is greater than a thickness t2 of the first electrically insulating layer structure 2 in the first non-covered portions 22. The first electrically insulating layer structure 2 can be a multilayer structure or a single layer structure. Yet, the first electrically insulating layer structure 2 can be a resin layer with copper and/or glass particles except for glass fibers on each side. The first electrically insulating layer structure 2 can comprise a core with further dielectric layers arranged thereon, which do not include glass fibers. However, such further dielectric layers can—but not need to—include glass particles on each side. For example, the recesses can be formed at non-covered portions of such further dielectric layer.

Preferably, patterns of the first electrically insulating layer structure 2 and of the first electrically conductive layer structure 3 can correspond to each other or be the same. A depth of the recesses, that means a difference between t1 and t2, can preferably be in a range of 1 to 25 μm.

The first electrically insulating layer structure 2 in the first covered portions 21 and the first non-covered portions 22 is integrally formed of the same material. The term "integrally formed of the same material" can be interpreted in that the first covered portions 21 have not been deposited or layered upon the remaining part of the first electrically insulating layer structure 2.

The stack further comprises a second electrically insulating layer structure 2, which is here identical to the first electrically insulating layer structure 2, and a second electrically conductive layer structure 4 arranged on the second electrically insulating layer structure 2. A thickness t3 of the first electrically conductive layer structure 3 is smaller than a thickness t4 of the second electrically conductive layer structure 4. Even though the patterns of the first and second electrically conductive layer structures 3, 4 look similar in FIG. 1, the patterns of first and second electrically conductive layer structures 3, 4 need not to be similar or symmetrical.

The second electrically conductive layer structure 4 can be formed by conventional photolithography and etching methods. The second electrically insulating layer structure 2 comprises a plurality of second covered portions 23, which are covered by the second electrically conductive layer structure 4, and a plurality of second non-covered portions 24, which are not covered by the second electrically conductive layer structure 4.

The component carrier 1 further comprises a first further electrically insulating layer structure 5 arranged on the first electrically conductive layer structure 3 and a second further electrically insulating layer structure 6 arranged on the second electrically conductive layer structure 4. The first and second further electrically insulating layer structures 5, 6 usually contain a dielectric material. A thickness of the first further electrically insulating layer structure 5 at the first non-covered portions 22 is not equal to a thickness of the second further electrically insulating layer structure 6 at the second non-covered portions 24. The term "not equal to" can be interpreted in that a difference between both above-mentioned thicknesses is larger than 5%, preferably larger than 10%.

In an alternative embodiment, a surface of the second electrically insulating layer structure 2, which is connected to the second electrically conductive layer structure 4, can also be patterned. In particular, the second electrically insulating layer structure 2 can comprise at the surface, which is connected to the second electrically conductive layer structure 4, recesses at each of the plurality of second non-covered portions 24. Preferably, patterns of the second electrically insulating layer structure 2 and of the second electrically conductive layer structure 4 can correspond to each other or be the same. The pattern in the second electrically insulating layer structure 2 at the surface, which is connected to the second electrically conductive layer structure 4, can preferably have a height in a range of 1 to 25 μm. In this case, a thickness of the first further electrically insulating layer structure 5 at the first non-covered portions 22 can be smaller than a thickness of the second further electrically insulating layer structure 6 at the second non-covered portions 24.

A surface ratio between a sum of all first covered portions 21 of the first electrically insulating layer structure 2 and the entire first electrically insulating layer structure 2 is less than 90% because the warpage of the component carrier 1 can be controlled in a good manner.

The first further electrically insulating layer structure 5 is made of a resin with fillers except for glass fibers to obtain excellent removal/etching results. In general, for warpage issues, the filler particles should be as small as possible.

However, relatively large filler particles are sometimes necessary to achieve an improved copper adhesion in the build-up stack. Therefore, the filler type needs to be adjusted based on needed roughness, and all sizes and types are possible (glass fillers, ceramic fillers, also without fillers), as long as there is no glass fibers or glass fiber mat in the resin of the first further electrically insulating layer structure 2.

The first further electrically insulating layer structure 5 can have different expansion/warpage/curing behaviors than the first electrically insulating layer structure 2 in order to counteract the warpage. However, in the best case, the first electrically insulating layer structure 2 and the first further electrically insulating layer structure 5 as well as the second further electrically insulating layer structure 6 can be the same dielectric materials. It is to be noted that a counteracting warpage behavior does not only depend on the material choice but can also occur due to different moments of curing. For example, the first electrically insulating layer structure 2 can already be cured when the recesses are formed, while the first further electrically insulating layer structure 5 and the second further electrically insulating layer structure 6 are only cured at a later stage. Thereby, the first further electrically insulating layer structure 5 can counteract the warpage behavior/volumetric shrinkage.

The component carrier 1 can comprise at least one of the following features: the component carrier 1 comprises at least one component being surface mounted on and/or embedded in the component carrier 1, wherein the at least one component is in particular selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier 1, and a logic chip; wherein at least one of the electrically conductive layer structures of the component carrier 1 comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide; wherein the component carrier 1 is shaped as a plate; wherein the component carrier 1 is configured as one of the group consisting of a printed circuit board, a substrate, and an interposer; wherein the component carrier 1 is configured as a laminate-type component carrier 1.

Figure 2:
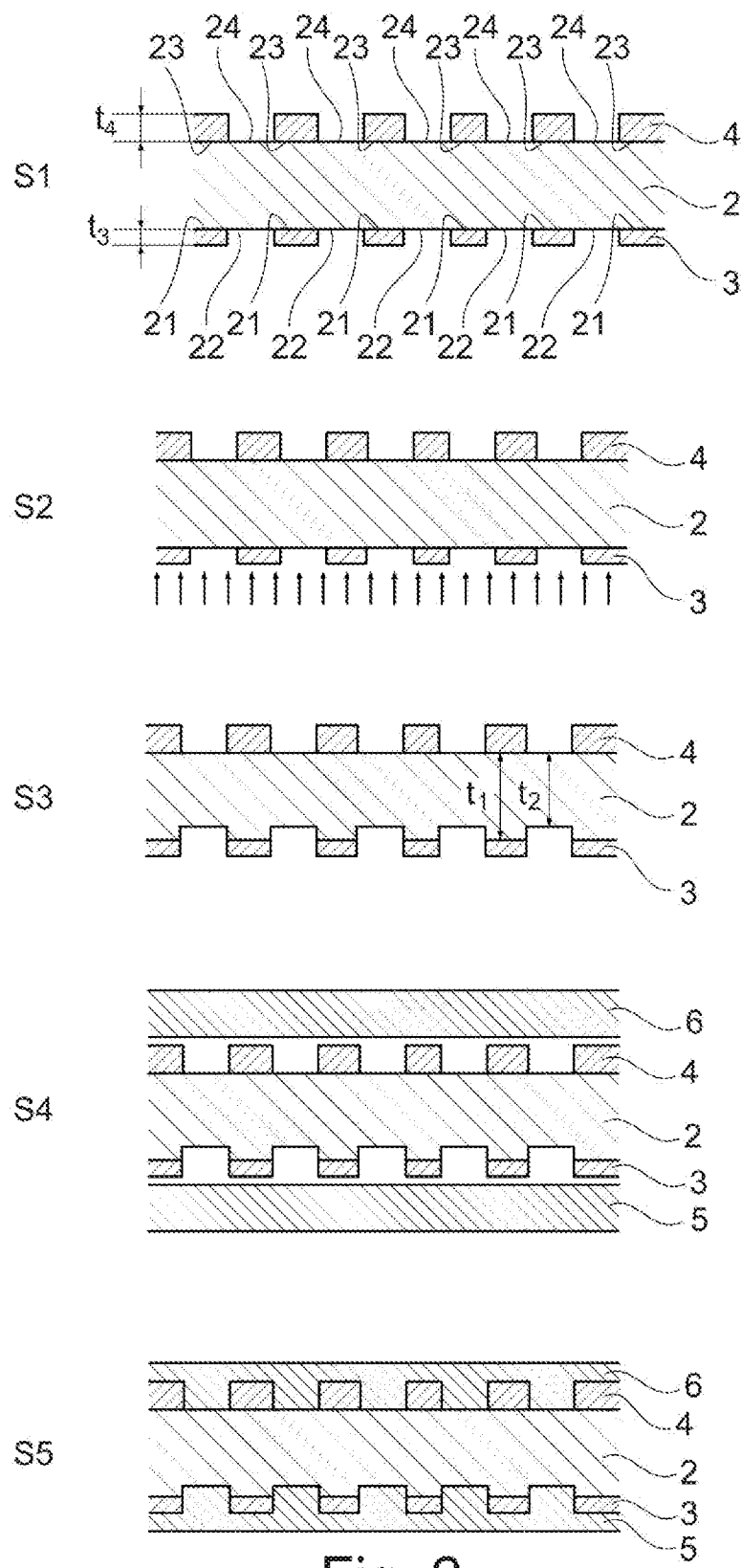
FIG. 2 illustrates a method of manufacturing a component carrier according to an exemplary embodiment of the invention.

FIG. 2 illustrates a method of manufacturing a component carrier 1 according to an exemplary embodiment of the invention.

In a step S1, a stack is provided with a first electrically insulating layer structure 2 and a first electrically conductive layer structure 3 arranged on the first electrically insulating layer structure 2. The first electrically conductive layer structure 3 is partially removed or patterned to obtain a plurality of first covered portions 21, where the first electrically insulating layer structure 2 is covered by the first electrically conductive layer structure 3, and a plurality of first non-covered portions 22, where the first electrically insulating layer structure 2 is not covered by the first electrically conductive layer structure 3. The patterning of the first electrically conductive layer structure 3 can be carried out by photolithography and etching methods, for example. Preferably, a surface ratio between a sum of all the first covered portions 21 of the first electrically insulating layer structure 2 and the entire first electrically insulating layer structure 2 is less than 90% so that the warpage of the component carrier 1 can be controlled in a good manner.

The stack further comprises a second electrically insulating layer structure 2, which is here identical to the first electrically insulating layer structure 2, and a second electrically conductive layer structure 4 arranged on the second electrically insulating layer structure 2 opposite to the first electrically conductive layer structure 3. The second electrically conductive layer structure 4 is partially removed or patterned to obtain a plurality of second covered portions 23, where the second electrically insulating layer structure 2 is covered by the second electrically conductive layer structure 4, and a plurality of second non-covered portions 24, where the second electrically insulating layer structure 2 is not covered by the second electrically conductive layer structure 4. The patterning of the second electrically conductive layer structure 4 can be carried out by photolithography and etching methods, for example. A thickness t3 of the first electrically conductive layer structure 3 is smaller than a thickness t4 of the second electrically conductive layer structure 4.

In a step S2, recesses are formed in the first electrically insulating layer structure 2 at each of the first non-covered portions 22. The step S2 can be carried out by plasma etching, reactive ion etching, selective laser dielectric removal, or selective sand blasting. A removal/etching depth can be between 1 to 25 μm. The plasma gas can be Ar, $CF_4$, $O_2$, $SF_6$ or any other suitable gas.

Step S3 shows the resulting stack, where a thickness t1 of the first electrically insulating layer structure 2 in the first covered portions 21 is greater than a thickness t2 of the first electrically insulating layer structure 2 in the first non-covered portions 22. A difference between the above-mentioned thicknesses is the removal/etching depth which can preferably be in a range of 1 to 25 μm. It is apparent that the first electrically insulating layer structure 2 in the first covered portions 21 and the first non-covered portions 22 is integrally formed of the same material as the first non-covered portions 22 are merely removed/etched-off.

In steps S4 and S5, a first further electrically insulating layer structure 5 is arranged on the first electrically conductive layer structure 3, and a second further electrically insulating layer structure 6 is arranged on the second electrically conductive layer structure 4. The first and second further electrically insulating layer structures 3, 5 can be arranged by laminating or by molding. Preferably, the first further electrically insulating layer structure 5 is made of a resin with fillers except for glass fibers. The resin can have a matrix of FR-4 or ABF®.

A thickness of the first further electrically insulating layer structure 5 at the first non-covered portion 22 is preferably not equal to a thickness of the second further electrically insulating layer structure 6 at the second non-covered portion 24, wherein the term "not equal to" can be interpreted that a difference between both above-mentioned thicknesses is larger than 5%, preferably larger than 10%.

The thickness of the first further electrically insulating layer structure 5 at the first non-covered portion 22 and the thickness of the second further electrically insulating layer structure 6 at the second non-covered portion 24, and consequently their volume shrinkage, are selected such that warpage is reduced or minimized.

According to FIG. 1, c is a thickness of the first further electrically insulating layer structure 5 at the first covered portion 21, d is a thickness of the first electrically conductive layer structure 3 at the first covered portion 21, and e is a depth of the recess. The above-mentioned steps S2 to S5 can be carried out such that e is selected based on c and d such that a warpage of the component carrier 1 is reduced or minimized. For example, the selection can be made based on a trial-and-error concept. In alternative embodiments, e can be selected by use of a simulation model with given values of c and d and/or by use of a warpage function w(e) which images the warpage, w, as a function of e with given values of c and d.

According to FIG. 1, a is a thickness of the second further electrically insulating layer structure 6 at the second covered portion 23 and b is a thickness of the second electrically conductive layer structure 4 at the second covered portion 23. The above-mentioned steps S2 to S5 can also be carried out such that e is selected based on a, b, c and d such that the warpage of the component carrier 1 is reduced or minimized. For example, the selection can be made based on a trial-and-error concept. In alternative embodiments, e can be selected by use of a simulation model with given values of a, b, c and d and/or by use of a warpage function w(e) which images the warpage, w, as a function of e with given values of a, b, c and d.

It is the intention to influence or counteract the warping power from the volumetric shrinkage of the first electrically insulating layer structure 2, wherein the volumetric shrinkage is used to reduce residual stress to balance the warpage. Based on customer design of the component carrier 1, the material removal to form the recesses is determined. The warpage function w(e) can provide information on how much material has to be removed, and on which layer in a multilayer component carrier. As a result, material can be removed from one layer, several layers or even all layers.

With regard to the shape of the recesses at the first non-covered portions 22, any shape is possible. For example, the recesses can have the shape of a cuboid having a rectangle bottom, where walls of the recess are perpendicular to the bottom. The recesses can also have a U-shaped or V-shaped cross-section. Also, the shape of the recesses can be determined based on the warpage function w(e) which is obtained during a simulation.

The first electrically insulating layer structure 2 comprises a plurality of first non-covered portions 22 which are not covered by the first electrically conductive layer structure 3. Although all of the first non-covered portions 22 of the plurality of first non-covered portions 22 are provided with a corresponding recess in the embodiment in FIG. 1, the embodiment can be modified in that the first electrically insulating layer structure 2 comprises at least one first non-covered portion 22 of the plurality of first non-covered portions 22, where the recess is not formed. For example, the component carrier 1 can comprise at least a part of a power section and at least a part of a control section, wherein the control section is configured to control the power section and the power section and the control section are at least partly formed by the first electrically conductive layer structure 3. The control section can comprise the recess, and the power section can comprise the at least one first non-covered portion 22 of the plurality of first non-covered portions 22, where the recess is not formed.

In other words, the present invention is applicable for fine line applications such as for the control section as well as for relatively thick copper applications such as for the power section. By selectively removing material/volume to form the recess, the warping behavior cannot only be compensated vertically top/bottom, i.e., mismatches in volumetric shrinkage and/or CTE on two different layers which are vertically stacked, but also with regard to horizontal differences within one single layer (for example the first electrically conductive layer structure 3), i.e., with regard to mismatches in volumetric shrinkage and/or CTE in the same layer, e.g., in a component carrier where the power section and the control section are located on same level. Therefore, the present invention is particularly advantageous for power applications having a power section, where rather few areas are substantially free of copper, and a control section, where less copper but a large first electrically insulating layer structure is usually present. The warpage compensation by forming the recess(es) has therefore to be done in areas of less copper, for example in the control section.

In a further modification, both the power section and the control section can each comprise at least one recess, wherein a depth of the recess in the power section is smaller than a depth of the recess in the control section.

Figure 3:
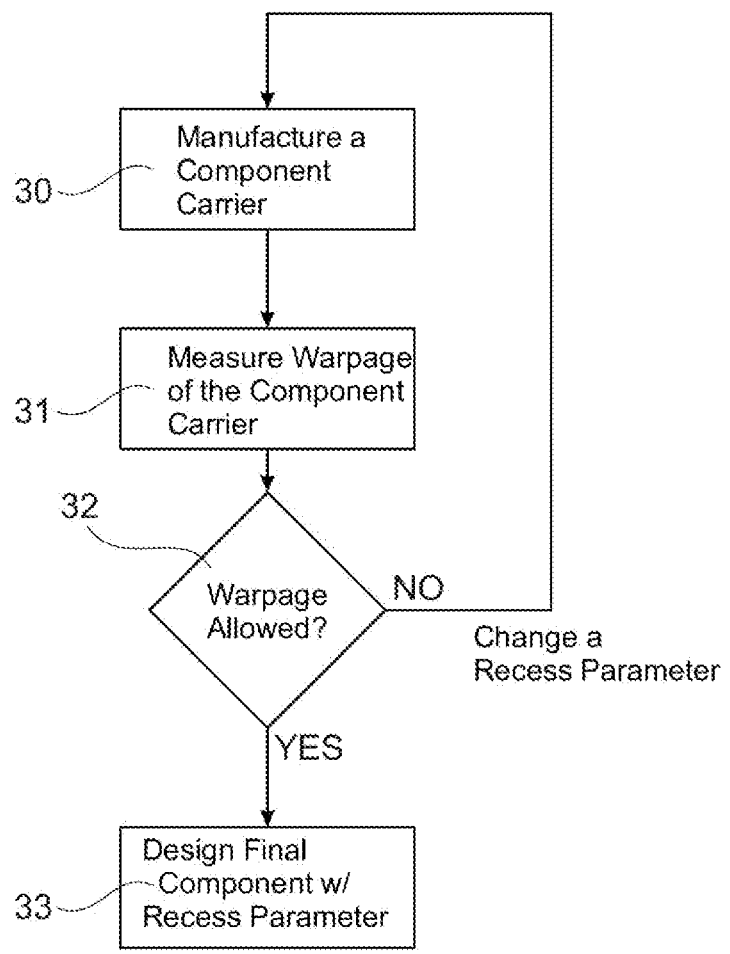
FIG. 3 illustrates a method of designing a component carrier.
Figure 4:
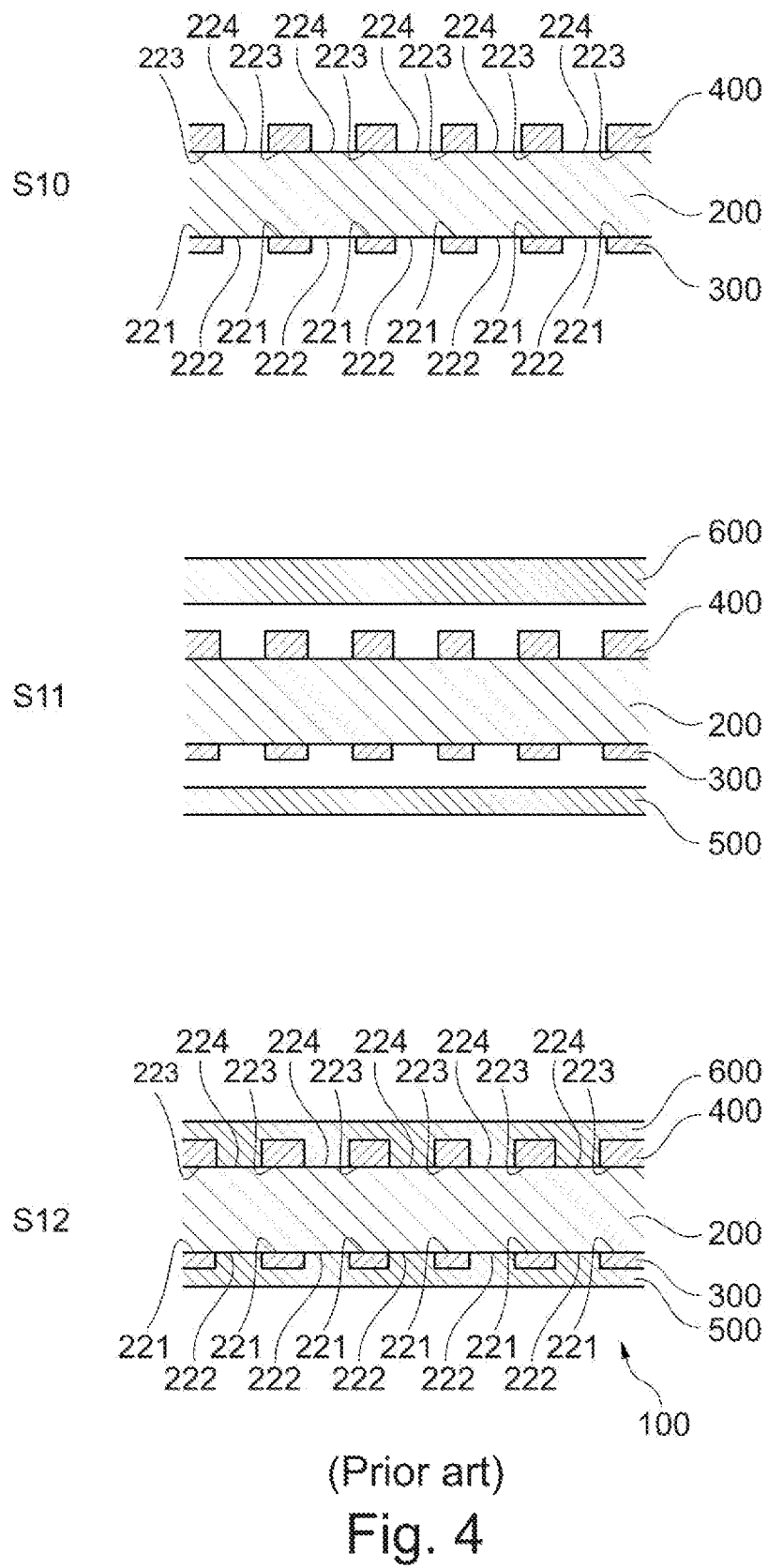
FIG. 4 illustrates a method of manufacturing a component carrier according to the prior art.

FIG. 3 illustrates a method of designing a component carrier 1.

In a step 30, the steps according the above-mentioned method of manufacturing a component carrier 1 are carried out.

In a step 31, a warpage of the component carrier 1 is measured.

In a step 32, it is determined whether or not the measured warpage is allowable.

If it is determined in step 32 that warpage is not allowable (NO), the steps 30 and 31 are repeated while a number, a location, and/or a depth of the at least one recess is changed.

Otherwise, if it is determined in step 32 that warpage is allowable (YES), the method proceeds to step 33, where the final component carrier 1 is designed by use of that number, location and/or depth of the at least one recess where the warpage is allowable.

The steps in FIG. 3 can also be carried out by a computer implemented method where a software model of the component carrier 100 is used.

In the present invention, a removal/etching amount of a resin of the first electrically insulating layer structure 2 can be determined to balance the warpage or warpage forces of the component carrier 1. The final stress behavior can be expressed as a function of a copper distribution, a copper thickness, previous layers geometries, etc.

While it is usually difficult to influence an intrinsic value of the used materials such as the CTE (coefficient of thermal expansion), volumetric shrinkage forces that are strongly related to the volume of a b-stage dielectric during lamination (for example prepreg or ABF®) can be influenced when the dielectric material of the first electrically insulating layer structure 2 at the first non-covered portions 22 is removed/etched away before laminating the first further electrically insulating layer structure 5. As a result, there is nearly no impact on a total dielectric thickness of the first electrically insulating layer structure 2 as the removed/etched-off areas of the first electrically insulating layer structure 2 at the first non-covered portions 22 are filled in a later step by the first further electrically insulating layer structure 5 (for example prepreg or ABF®) which can be laminated on the top and bottom of the stack. The present invention thus offers advantages in the design for warpage optimization.

The present invention offers a design approach for warpage management where the variable volume would have a high impact on warpage performance (for example where shrinkages of the dielectric materials and/or the CTE have a high impact on warpage). This reduces the impact of material selection as well, and thus allows to consider broader classes of materials. The present invention allows a next level of asymmetric design concepts (asymmetric in terms of copper thickness and dielectric thickness, and/or in terms of layer counts). The inventive methods are low-cost processes as well which allow to enlarge design capabilities and can use software approaches in modelling the warpage using a dielectric (resin) volume as key variable. Based on software modelling results, a variation in volume by a selective material removal to form the recess can optionally be combined with tuning the overall CTE by choosing materials with different CTEs to compensate for the warping behavior.

It should be noted that the term "comprising" does not exclude other elements or steps and the articles "a" or "an" do not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
a stack having a first electrically insulating layer structure and a first electrically conductive layer structure arranged on the first electrically insulating layer structure, wherein
the first electrically insulating layer structure comprises at least one first covered portion, which is covered by the first electrically conductive layer structure, and at least one first non-covered portion, which is not covered by the first electrically conductive layer structure; and
the first electrically insulating layer structure comprises a recess at the at least one first non-covered portion; wherein:
the stack further comprises a second electrically insulating layer structure and a second electrically conductive layer structure arranged on the second electrically insulating layer structure opposite to the first electrically conductive layer structure,
the second electrically insulating layer structure comprises at least one second covered portion, which is covered by the second electrically conductive layer structure, and at least one second non-covered portion, which is not covered by the second electrically conductive layer structure;
the component carrier further comprises a first further electrically insulating layer structure arranged on the first electrically conductive layer structure and a second further electrically insulating layer structure arranged on the second electrically conductive layer structure; and
a thickness of the first further electrically insulating layer structure at the first non-covered portion is not equal to a thickness of the second further electrically insulating layer structure at the second non-covered portion;
wherein the first further electrically insulating layer structure fills the recess in the first electrically insulating layer structure.

2. The component carrier according to claim 1, wherein a thickness of the first electrically insulating layer structure in the first covered portion is greater than a thickness of the first electrically insulating layer structure in the first non-covered portion.

3. The component carrier according to claim 1, wherein the first electrically insulating layer structure in the first covered portion and the first non-covered portion is integrally formed of the same material.

4. The component carrier according to claim 1, wherein a thickness of the first electrically conductive layer structure is smaller than a thickness of the second electrically conductive layer structure.

5. The component carrier according to claim 1, wherein a surface ratio between a sum of all first covered portions of the first electrically insulating layer structure and the entire first electrically insulating layer structure is less than 90%.

6. The component carrier according to claim 1, wherein the first further electrically insulating layer structure is made of a resin with fillers except for glass fibers.

7. The component carrier according to claim 1, comprising at least one of the following features:
the component carrier comprises at least one component being surface mounted on and/or embedded in the component carrier, wherein the at least one component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of the group consisting of copper, aluminum, nickel, silver, gold, palladium, and tungsten;
wherein the electrically insulating layer structure comprises at least one of the group consisting of reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
wherein the component carrier is shaped as a plate;
wherein the component carrier is configured as one of the group consisting of a printed circuit board, a substrate, and an interposer;
wherein the component carrier is configured as a laminate-type component carrier.

8. The component carrier according to claim 1, wherein:
the first electrically insulating layer structure comprises a plurality of first non-covered portions which are not covered by the first electrically conductive layer structure; and the first electrically insulating layer structure comprises at least one first non-covered portion of the plurality of first non-covered portions, where the recess is not formed.

9. The component carrier according to claim 8, wherein:
the component carrier comprises at least a part of a power section and at least a part of a control section, wherein the control section is configured to control the power section; the power section and the control section are at least partly formed by the first electrically conductive layer structure; and
the control section comprises the recess, and the power section comprises the at least one first non-covered portion of the plurality of first non-covered portions, where the recess is not formed.

10. A method of manufacturing a component carrier, the method comprising the following steps:
providing a stack having a first electrically insulating layer structure and a first electrically conductive layer structure arranged on the first electrically insulating layer structure;
partially removing the first electrically conductive layer structure to obtain at least one first covered portion, where the first electrically insulating layer structure is covered by the first electrically conductive layer structure, and at least one first non-covered portion, where the first electrically insulating layer structure is not covered by the first electrically conductive layer structure; and
forming a recess in the first electrically insulating layer structure at the at least one first non-covered portion, wherein:
the stack further comprises a second electrically insulating layer structure and a second electrically conductive layer structure arranged on the second electrically insulating layer structure opposite to the first electrically conductive layer structure, wherein the method further comprises:
partially removing the second electrically conductive layer structure to obtain at least one second covered portion, where the second electrically insulating layer structure is covered by the second electrically conductive layer structure, and at least one second non-covered portion, where the second electrically insulating layer structure is not covered by the second electrically conductive layer structure;
arranging a first further electrically insulating layer structure on the first electrically conductive layer structure;
arranging a second further electrically insulating layer structure on the second electrically conductive layer structure; and
a thickness of the first further electrically insulating layer structure at the first non-covered portion is not equal to a thickness of the second further electrically insulating layer structure at the second non-covered portion;
wherein the first further electrically insulating layer structure fills the recess in the first electrically insulating layer structure.

11. The method according to claim 10, wherein the step of forming the recess, by plasma etching, reactive-ion etching, selective laser dielectric removal, or selective sand blasting, is carried out such that a thickness of the first electrically insulating layer structure in the first covered portion is greater than a thickness of the first electrically insulating layer structure in the first non-covered portion.

12. The method according to claim 10, wherein the first electrically insulating layer structure in the first covered portion and the first non-covered portion is integrally formed of the same material.

13. The method according to claim 10, wherein a thickness of the first electrically conductive layer structure is smaller than a thickness of the second electrically conductive layer structure.

14. The method according to claim 10, wherein c is a thickness of the first further electrically insulating layer structure at the first covered portion,
d is a thickness of the first electrically conductive layer structure at the first covered portion, and
e is a depth of the recess; wherein
e is selected based on c, d such that a warpage of the component carrier is reduced or minimized.

15. The method according to claim 14, wherein e is selected by use of a simulation model with given values of c, d and/or by use of a warpage function which images the warpage as a function of e with given values of c, d.

16. The method according to claim 10, wherein:
a is a thickness of the second further electrically insulating layer structure at the second covered portion,
b is a thickness of the second electrically conductive layer structure at the second covered portion,
c is a thickness of the first further electrically insulating layer structure at the first covered portion,
d is a thickness of the first electrically conductive layer structure at the first covered portion, and
e is a depth of the recess; wherein
e is selected based on a, b, c, d such that a warpage of the component carrier is reduced or minimized.

17. The method according to claim 16, wherein e is selected by use of a simulation model with given values of a, b, c, d and/or by use of a warpage function which images the warpage as a function of e with given values of a, b, c, d.

18. The method according to claim 10, wherein a surface ratio between a sum of all the first covered portions of the first electrically insulating layer structure and the entire first electrically insulating layer structure is less than 90%.

19. The method according to claim 10, wherein the first further electrically insulating layer structure is made of a resin with fillers except for glass fibers.

20. The method according to claim 10, wherein:
the first electrically insulating layer structure comprises a plurality of first non-covered portions which are not covered by the first electrically conductive layer structure; and
the first electrically insulating layer structure comprises at least one first non-covered portion of the plurality of first non-covered portions, where the recess is not formed.

21. The method according to claim 20, wherein:
the component carrier comprises at least a part of a power section and at least a part of a control section, wherein the control section is configured to control the power section;
the power section and the control section are at least partly formed by the first electrically conductive layer structure; and
the control section comprises the recess, and the power section comprises the at least one first non-covered portion of the plurality of first non-covered portions, where the recess is not formed.

22. The method of claim 10, wherein arranging a first further electrically insulating layer structure on the first electrically conductive layer structure includes filling the recess in the first electrically insulating layer structure.

23. A component carrier, comprising:
- a stack having a first electrically insulating layer structure and a first electrically conductive layer structure arranged on the first electrically insulating layer structure, wherein
- the first electrically insulating layer structure comprises at least one first covered portion, which is covered by the first electrically conductive layer structure, and at least one first non-covered portion, which is not covered by the first electrically conductive layer structure; and
- the first electrically insulating layer structure comprises a recess at the at least one first non-covered portion; wherein:
- the stack further comprises a second electrically insulating layer structure and a second electrically conductive layer structure arranged on the second electrically insulating layer structure opposite to the first electrically conductive layer structure,
- the second electrically insulating layer structure comprises at least one second covered portion, which is covered by the second electrically conductive layer structure, and
- at least one second non-covered portion, which is not covered by the second electrically conductive layer structure;
- the component carrier further comprises a first further electrically insulating layer structure arranged on the first electrically conductive layer structure and a second further electrically insulating layer structure arranged on the second electrically conductive layer structure; and
- a thickness of the first further electrically insulating layer structure at the first noncovered portion is not equal to a thickness of the second further electrically insulating layer structure at the second non-covered portion;
- wherein the first electrically insulating layer structure comprises a plurality of first noncovered portions which are not covered by the first electrically conductive layer structure; and
- wherein the first electrically insulating layer structure comprises at least one first non-covered portion of the plurality of first non-covered portions, where the recess is not formed;
- wherein the component carrier comprises at least a part of a power section and at least a part of a control section, wherein the control section is configured to control the power section;
- wherein the power section and the control section are at least partly formed by the first electrically conductive layer structure; and
- wherein the control section comprises the recess, and the power section comprises the at least one first non-covered portion of the plurality of first non-covered portions, where the recess is not formed.

* * * * *